(12) United States Patent
Hutchings et al.

(10) Patent No.: US 9,087,694 B2
(45) Date of Patent: Jul. 21, 2015

(54) ULTRA-LARGE GRAIN POLYCRYSTALLINE SEMICONDUCTORS THROUGH TOP-DOWN ALUMINUM INDUCED CRYSTALLIZATION (TAIC)

(71) Applicants: Douglas Arthur Hutchings, Elkins, AR (US); Seth Daniel Shumate, Fayetteville, AR (US); Hameed Naseem, Fayetteville, AR (US)

(72) Inventors: Douglas Arthur Hutchings, Elkins, AR (US); Seth Daniel Shumate, Fayetteville, AR (US); Hameed Naseem, Fayetteville, AR (US)

(73) Assignees: Silicon Solar Solutions, LLC, Fayetteville, AR (US); Board of Trustees of the University of Arkansas, Little Rock, AR (US)

( * ) Notice: Subject to any disclaimer, the term of this patent is extended or adjusted under 35 U.S.C. 154(b) by 30 days.

(21) Appl. No.: 13/905,966

(22) Filed: May 30, 2013

(65) Prior Publication Data

US 2013/0320342 A1   Dec. 5, 2013

Related U.S. Application Data

(60) Provisional application No. 61/654,903, filed on Jun. 3, 2012, provisional application No. 61/798,888, filed on Mar. 15, 2013.

(51) Int. Cl.
| | |
|---|---|
| *H01L 29/04* | (2006.01) |
| *H01L 29/10* | (2006.01) |
| *H01L 21/02* | (2006.01) |

(52) U.S. Cl.
CPC ...... *H01L 21/02612* (2013.01); *H01L 21/0245* (2013.01); *H01L 21/02422* (2013.01); *H01L 21/02488* (2013.01); *H01L 21/02529* (2013.01); *H01L 21/02532* (2013.01);
(Continued)

(58) Field of Classification Search
USPC .......... 257/49, 42–47, 621, 774, 50–75, 183, 257/E21.133, E21.412, E31.043, E21.414, 257/E21.415, E31.047; 438/95, 96, 97, 98, 438/491, 495, 479, 478; 252/500
See application file for complete search history.

(56) References Cited

U.S. PATENT DOCUMENTS

| | | | |
|---|---|---|---|
| 6,339,013 B1 * | 1/2002 | Naseem et al. | ............... 438/491 |
| 6,613,653 B2 | 9/2003 | Naseem et al. | |

(Continued)

FOREIGN PATENT DOCUMENTS

EP        2006903 A2   12/2008

OTHER PUBLICATIONS

International Preliminary Report on Patentability (Chapter 1) for International Application No. PCTUS2013/043759, mailed Dec. 9, 2014, 6 pages.

(Continued)

*Primary Examiner* — Dao H Nguyen
*Assistant Examiner* — Tram H Nguyen
(74) *Attorney, Agent, or Firm* — Blakely Sokoloff Taylor & Zafman LLP

(57) ABSTRACT

A seed layer structure is annealed. The seed layer structure comprises a crystallization catalyst material on a seed semiconductor over a substrate. The seed semiconductor comprises an amorphous portion. Annealing of the seed layer structure converts the amorphous portion into a crystalline portion. The crystalline portion is connected to the substrate by subsurface crystal legs. The crystallization catalyst material formed underneath the crystalline portion by annealing is removed from the underneath of the crystalline portion.

9 Claims, 12 Drawing Sheets

(52) U.S. Cl.
CPC ... *H01L 21/02639* (2013.01); *H01L 21/02647* (2013.01); *H01L 21/02658* (2013.01); *H01L 21/02664* (2013.01); *H01L 21/02672* (2013.01); *H01L 29/04* (2013.01)

(56) References Cited

U.S. PATENT DOCUMENTS

| | | | |
|---|---|---|---|
| 6,884,248 B2 | 4/2005 | Bolduc et al. | |
| 7,202,143 B1 * | 4/2007 | Naseem et al. | 438/486 |
| 7,683,373 B2 | 3/2010 | Park et al. | |
| 7,687,334 B2 | 3/2010 | Zou et al. | |
| 7,927,937 B2 | 4/2011 | Zou et al. | |
| 2004/0106227 A1 | 6/2004 | Naseem et al. | |
| 2010/0191099 A1 | 7/2010 | Salerno et al. | |
| 2010/0237272 A1 * | 9/2010 | Chaudhari et al. | 252/62.55 |
| 2011/0114961 A1 | 5/2011 | Lee et al. | |
| 2012/0049199 A1 | 3/2012 | Chung et al. | |

OTHER PUBLICATIONS

PCT Notification of Transmittal of the International Search Report and the Written Opinion of the International Searching Authority, or the Declaration with the International Search Report (ISR) for International Application No. PCT/US2013/043759, mailed Aug. 27, 2013, 5 pages.

PCT Written Opinion for International Application No. PCTUS2013/043759, mailed Aug. 27, 2013, 5 pages.

* cited by examiner

SEM and EBSD of preliminary TAIC large grain polysilicon films with grain gaps on glass

US 9,087,694 B2

ULTRA-LARGE GRAIN POLYCRYSTALLINE SEMICONDUCTORS THROUGH TOP-DOWN ALUMINUM INDUCED CRYSTALLIZATION (TAIC)

GOVERNMENT LICENSE RIGHTS

This invention was made with government support under Small Business Innovation Research Grant Award No. IIP-1248962 awarded by National Science Foundation. The government has certain rights in the invention.

CROSS-REFERENCE TO RELATED APPLICATIONS

This patent application claims priority to U.S. Provisional Application No. 61/654,903, filed on Jun. 3, 2012, and claims priority to U.S. Provisional Application No. 61/798,888, filed on Mar. 15, 2013, which are incorporated by reference herein in their entirety.

FIELD

Embodiments as described herein relate to electronic device manufacturing, and more particularly, to semiconductor crystallization.

BACKGROUND

Typically, top-down aluminum induced crystallization ("TAIC") refers to a technique to crystallize amorphous silicon. The amorphous silicon is crystallized into grains of crystalline silicon. In order to create high quality silicon for devices, however, temperatures in excess of the eutectic temperature of aluminum and the semiconductor are used.

SUMMARY

Embodiments of apparatuses and methods to provide ultra-large grain polycrystalline semiconductors through top-down aluminum induced crystallization ("TAIC") are described. In one embodiment, a seed layer structure is annealed. The seed layer structure comprises a crystallization catalyst material on a seed semiconductor layer over a substrate. The seed semiconductor layer comprises an amorphous portion. Annealing of the seed layer structure converts the amorphous portion into a crystalline portion and drives a portion of the crystallization catalyst material to the substrate underneath the crystalline portion. The crystalline portion is connected to the substrate by subsurface crystal legs. The crystallization catalyst material formed underneath the crystalline portion is removed from the underneath of the crystalline portion.

In one embodiment, an apparatus comprises a substrate, and a crystalline seed semiconductor portion connected to the substrate by subsurface crystal legs. The subsurface crystal legs are separated by cavities.

In one embodiment, an apparatus comprises a crystalline seed semiconductor portion formed on a carrier substrate. An epitaxial semiconductor layer is grown on the crystalline seed semiconductor portion.

In one embodiment, the carrier substrate is removed from the crystalline seed semiconductor portion. In one embodiment, the epitaxial semiconductor layer is attached to a second substrate.

Other features and advantages of embodiments will be apparent from the accompanying drawings and from the detailed description that follows below.

BRIEF DESCRIPTION OF DRAWINGS

The present invention is illustrated by way of example and not limitation in the figures of the accompanying drawings, in which like references indicate similar elements, in which:

FIG. 3H is a view similar to FIG. 3G after the substrate is removed from the seed crystalline portions having the epitaxial semiconductor layer deposited on.

DETAILED DESCRIPTION

Figure 1:
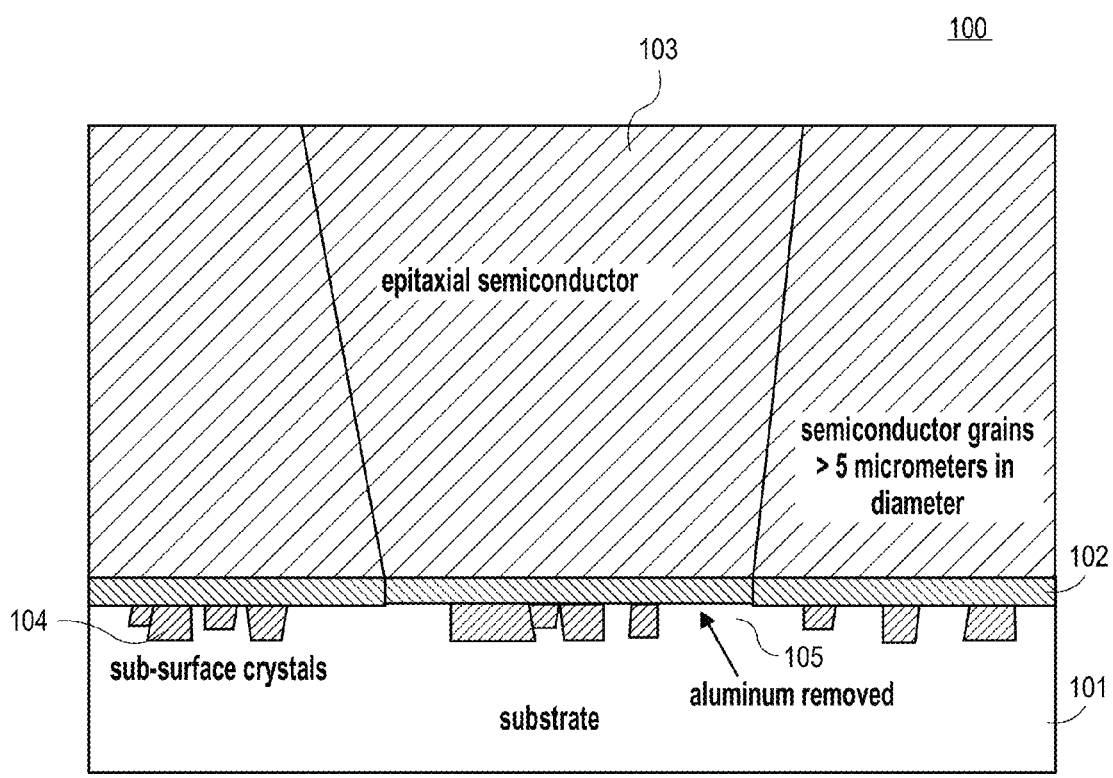
FIG. 1 shows a view of an exemplary embodiment of a semiconductor structure manufactured using a top down crystallization catalyst induced crystallization method as described herein.

The embodiments will be described with references to numerous details set forth below, and the accompanying drawings. The following description and drawings are illustrative of the embodiments and are not to be construed as limiting. Numerous specific details are described to provide a thorough understanding of the embodiments as described herein. However, in certain instances, well known or conventional details are not described in order to not unnecessarily obscure the embodiments in detail.

Reference throughout the specification to "at least some embodiments", "another embodiment", or "an embodiment" means that a particular feature, structure, or characteristic described in connection with the embodiment is included in at least some embodiments as described herein. Thus, the appearance of the phrases "in at least some embodiments" or "in an embodiment" in various places throughout the specification are not necessarily all referring to the same embodiment. Furthermore, the particular features, structures, or characteristics may be combined in any suitable manner in one or more embodiments.

Embodiments of apparatuses and methods to provide ultra-large grain polycrystalline semiconductors through top-down aluminum induced crystallization ("TAIC") are described.

All work done previously was focused on layers with the goal of creating a high quality layer of poly-silicon from amorphous silicon. What was not reported was the fact that regions of aluminum were forming beneath the layer of crystalline silicon. The aluminum is moved underneath the crystalline silicon during crystallization. Presence of aluminum underneath of crystalline silicon can cause electric short for the device resulting in the device failure. Presence of aluminum underneath of crystalline silicon effectively shorts the device and made it impractical for device applications.

In one embodiment, a seed layer structure is annealed. The seed layer structure comprises a crystallization catalyst material on a seed semiconductor over a substrate. The seed semiconductor comprises an amorphous portion. Annealing of the seed layer structure is to convert the amorphous portion into a crystalline portion. The crystalline portion is connected to the substrate by subsurface crystal legs. The crystallization catalyst material formed underneath the crystalline portion by annealing is removed from the underneath the crystalline portion. That is, embodiments described herein allow removal of the crystallization catalyst material contamination from under the crystalline film.

In one embodiment, an apparatus comprises a substrate, and a seed semiconductor over the substrate. The seed semiconductor structure comprises a mesa-like crystalline portion connected to the substrate by subsurface crystal legs. The subsurface crystal legs are separated by cavities. In one embodiment, the seed semiconductor structure has a plurality of crystalline semiconductor mesas connected to the substrate by subsurface crystal legs. In one embodiment, a crystalline semiconductor (e.g., silicon) is epitaxially grown on the surface of the plurality of crystalline semiconductor mesas connected to the substrate by subsurface crystal legs.

In one embodiment, an apparatus comprises a seed semiconductor. The seed semiconductor comprises a crystalline portion. A crystalline semiconductor layer is on the seed semiconductor layer. A carrier substrate is removed from the crystalline semiconductor layer on the seed semiconductor. That is, the resulting crystalline semiconductor layer on the seed semiconductor is removed from the carrier substrate due to a limited number of subsurface crystal legs that act as contact points to the substrate.

Top-down aluminum induced crystallization ("TAIC") of amorphous group IV solids such as silicon, germanium, carbon, or any alloyed combination is a very promising process to create device quality crystallized semiconductor material on low cost substrates. The amorphous semiconductor is crystallized into very large grains (more than 5 micrometers) of crystalline semiconductor. These grains are attached to the surface by subsurface crystals whose density can be controlled to control the adhesion properties of the crystalline film to the substrate. In one embodiment, the density of holes in the polycrystalline semiconductor thin-films is controlled to allow the chemical removal of aluminum from underneath the crystalline surface. In one embodiment, the adhesion between the TAIC crystal and the substrate is controlled. This adhesion is directly related to the density of sub-surface crystals which are attached to both the surface crystal and the substrate. In one embodiment, controlling the density of holes and the adhesion allow the removal of entire thin-film layers from the substrate.

FIG. 1 shows a view 100 of an exemplary embodiment of a semiconductor structure manufactured using a top down crystallization catalyst induced crystallization method as described herein. The semiconductor structure comprises a substrate 101. In one embodiment, substrate 101 is a glass substrate, e.g., Corning Eagle XG glass substrate. In one embodiment, substrate 101 is a semiconductor substrate. In other embodiments, substrate 101 is other material substrate. Seed semiconductor layer comprises a polycrystalline portion 102 over subsurface crystals ("legs"), such as a subsurface crystal leg 104. In one embodiment, seed semiconductor layer is silicon. In other embodiments, the seed semiconductor layer is any other semiconductor, e.g., silicon carbide, germanium, other semiconductor material, or any alloyed combination material. In one embodiment, polycrystalline portion 102 comprises crystalline semiconductor grains having diameter of more than 5 micrometers ("μm"). As shown in FIG. 1, the subsurface crystal legs, such as subsurface crystal leg 104 extend from polycrystalline portion 102 to substrate 101. As shown in FIG. 1, polycrystalline portion 102 is connected to substrate 101 by the subsurface crystal legs. The subsurface crystal legs are separated by hollow spaces ("cavities"), such as a cavity 105. As shown in FIG. 1, the crystallization catalyst material (e.g., aluminum, nickel, or gold) is removed from underneath of the polycrystalline portion 102 forming cavity 105. As shown in FIG. 1, substrate 101 is attached to sub-surface crystals 104, attached to surface crystals 102, and is attached to an epitaxial semiconductor 103 grown on top of the top down crystallization catalyst induced (e.g., TAIC) crystalline seed semiconductor layer. In one embodiment, epitaxial semiconductor 103 comprises crystalline semiconductor grains having diameter of more than 5 μm.

Figure 2A:
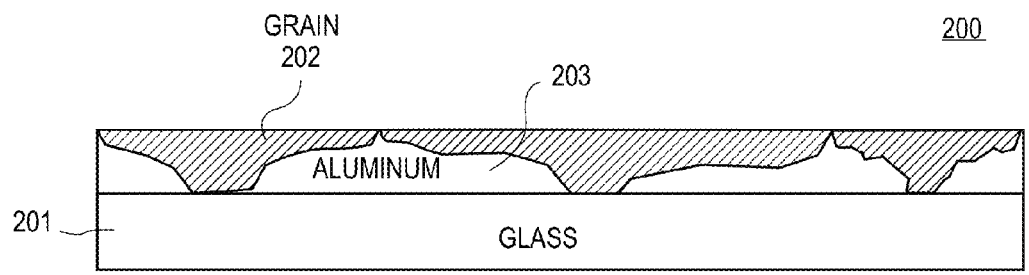
FIG. 2A shows a cross-sectional view of one embodiment of a seed semiconductor layer on a substrate after top down crystallization catalyst induced crystallization.

FIG. 2A shows a cross-sectional view 200 of one embodiment of a seed semiconductor layer on a substrate after crystallization catalyst induced crystallization but before the crystallization catalyst material removal. Crystallization catalyst material 203 (e.g., aluminum) is formed on a glass substrate 201 underneath seed semiconductor layer having grains, such as a grain 202. The seed semiconductor layer on the substrate as depicted in FIG. 2A represents the seed semiconductor layer as depicted in FIG. 1.

Figure 2B:
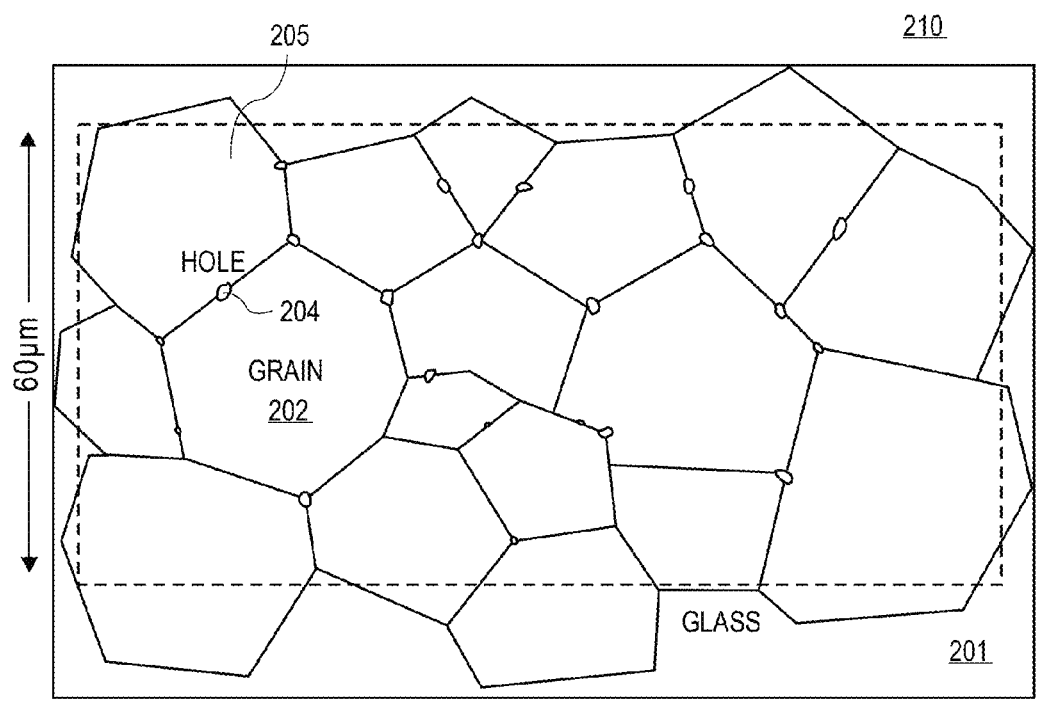
FIG. 2B shows a top view of one embodiment of a portion of the seed semiconductor layer on the substrate as shown in FIG. 2A.

FIG. 2B shows a top view 210 of one embodiment of a portion of the seed semiconductor layer on the substrate as shown in FIG. 2A. FIG. 2B shows that an exemplary size of the portion is about 60 micrometers ("μm"). Holes, such as a hole 204 are formed at a boundary between polycrystalline grains, e.g., a grain 202 and a grain 205 formed on glass substrate 201. In one embodiment, an amount of holes, e.g., hole 204, per unit of area ("density") needed to remove the crystallization catalyst material (e.g., aluminum, from underneath the seed semiconductor layer is controlled. In one embodiment, an amount of subsurface crystals, e.g., subsurface crystal 104, per unit area ("density") is controlled, as described in further detail below.

In one embodiment, both the hole density necessary to remove aluminum and the density of sub-surface crystals, and thus adhesion of the TAIC structure to the underlying substrate are controlled by changing a ratio of the crystallization catalyst material (e.g., aluminum) and amorphous semiconductor (e.g., amorphous silicon) in the initial seed structure before crystallization.

Figure 3A:
FIG. 3A shows a cross-sectional view of one embodiment of a semiconductor structure to provide top-down crystallization catalyst induced crystallization.

FIG. 3A shows a cross-sectional view 300 of one embodiment of a semiconductor structure to provide top-down crystallization catalyst induced crystallization. The semiconductor structure comprises a substrate 301. In one embodiment, substrate 301 is a glass substrate, e.g., Corning Eagle XG glass substrate. In one embodiment, substrate 301 is a semiconductor substrate. In other embodiments, substrate 301 is other material substrate. In one embodiment, the substrate 301 is subjected to cleaning. In one embodiment, cleaning of the substrate involves 10 minutes sonication in acetone followed by rinse in deionized ("DI") water, 10 minutes sonication in methanol followed by DI water rinse; and drying in nitrogen $N_2$ gas.

Figure 3B:
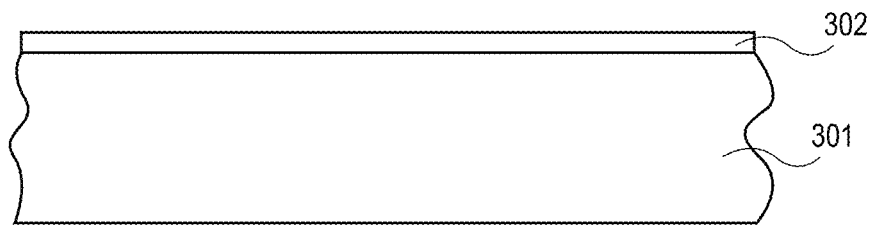
FIG. 3B is a view similar to FIG. 3A after a thin layer of insulating material is deposited on the substrate.

FIG. 3B is a view 310 similar to FIG. 3A after a thin layer of an insulating material 302 is deposited on substrate 301. Insulating layer 302 can be optionally deposited to insulate the substrate 301 from the semiconductor material deposited thereon at a later stage. In one embodiment, layer 302 is an oxidized semiconductor layer (e.g., silicon oxide layer). In other embodiments, layer 302 is other insulating material layer. In one embodiment, insulating layer 302 is deposited onto a glass substrate using plasma enhanced chemical vapor deposition ("PECVD"). In one embodiment, insulating layer 302 is deposited onto substrate 301 at pressure about 900 mTorr, power of about 25 Watt ("W"), at a temperature about 175° C., at a flow rate of $SiH_4$ about 32 standard cubic centimeter per minute ("sccm"), at a flow rate of $N_2O$ about 900 sccm; at a flow rate of $N_2$ about 400 sccm; for about 10 minutes. In one embodiment, the thickness of the insulating layer 302 is from about 300 nanometers ("nm") to about 500 nm. In one embodiment, the thickness of the insulating layer 302 is about 400 nanometers ("nm")

Figure 3C:
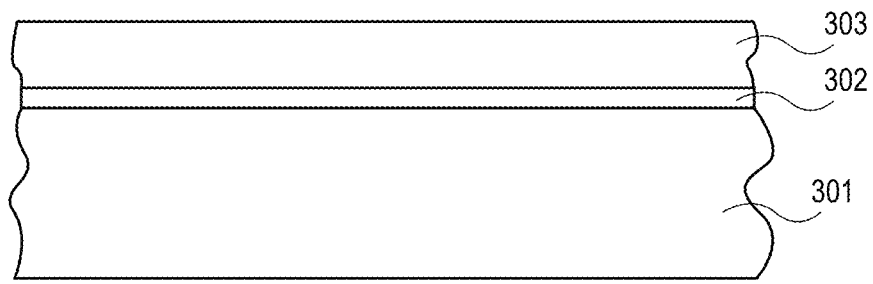
FIG. 3C is a view similar to FIG. 3B after a seed semiconductor layer having an amorphous portion is deposited onto the insulating layer on the substrate.

FIG. 3C is a view 320 similar to FIG. 3B after a seed semiconductor layer having an amorphous portion 303 is deposited onto the insulating layer 302 on the substrate 301. The seed semiconductor can be any known semiconducting material including silicon, silicon carbide, germanium, and other semiconductor material. In one embodiment, the insulating layer 302 is not deposited, and the seed semiconductor layer having an amorphous portion 303 is deposited directly onto the substrate 301. In one embodiment, seed semiconductor layer 303 comprising amorphous hydrogenated silicon (e.g., a-Si:H) is deposited onto insulating layer 302 using PECVD at pressure 900 mTorr, power of about 50 Watt ("W"), at a temperature about 175° C., at a flow rate of $SiH_4$ about 240 sccm for about 10 minutes. In one embodiment, the thickness of the seed semiconductor layer 303 is from about 200 nm to about 2 μm. In one embodiment, the thickness of the seed semiconductor layer 303 is from about 200 nm to about 400 nm. In one embodiment, the thickness of the seed semiconductor layer 303 is about 300 nm. In one embodiment, another optional insulating layer (e.g., $SiO_2$) (not shown) is deposited onto the seed semiconductor layer 303. The processing conditions (e.g., temperature, pressure, flow rates) are the same as for depositing of the insulating layer 302, but the process is performed for time shorter than time for depositing insulating layer 302, e.g., only for about 1-2 seconds. The optional insulating layer is described in further detail with respect to FIG. 5.

Figure 3D:
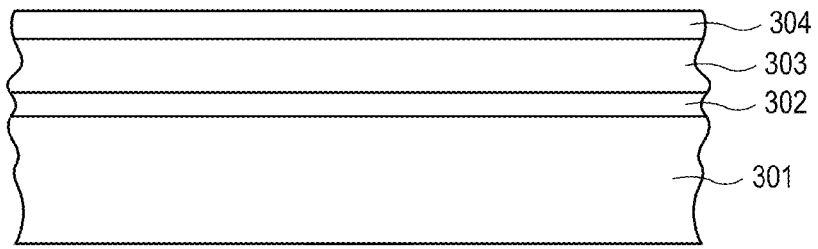
FIG. 3D is a view similar to FIG. 3C after a crystallization catalyst material is deposited onto a seed semiconductor layer having an amorphous portion on the insulating layer on the substrate.

FIG. 3D is a view 330 similar to FIG. 3C after a crystallization catalyst material 304 is deposited onto a seed semiconductor layer having an amorphous portion 303 on the insulating layer 302 on the substrate 301. The crystallization catalyst material can include a metal e.g., aluminum, nickel, gold, or other metals. In one embodiment, the crystallization catalyst material 304 is deposited using one of evaporation techniques known to one of ordinary skill in the art of electronic device manufacturing. In one embodiment, crystallization catalyst material 304 is aluminum. In one embodiment, crystallization catalyst material 304 is other metal, e.g., nickel, gold, or other crystallization catalyst material. In one embodiment, the thickness of the crystallization catalyst material layer 304 is from about 100 nm to about 150 nm. In one embodiment, the thickness of the crystallization catalyst material layer 304 is about 130 nm.

Figure 3E:
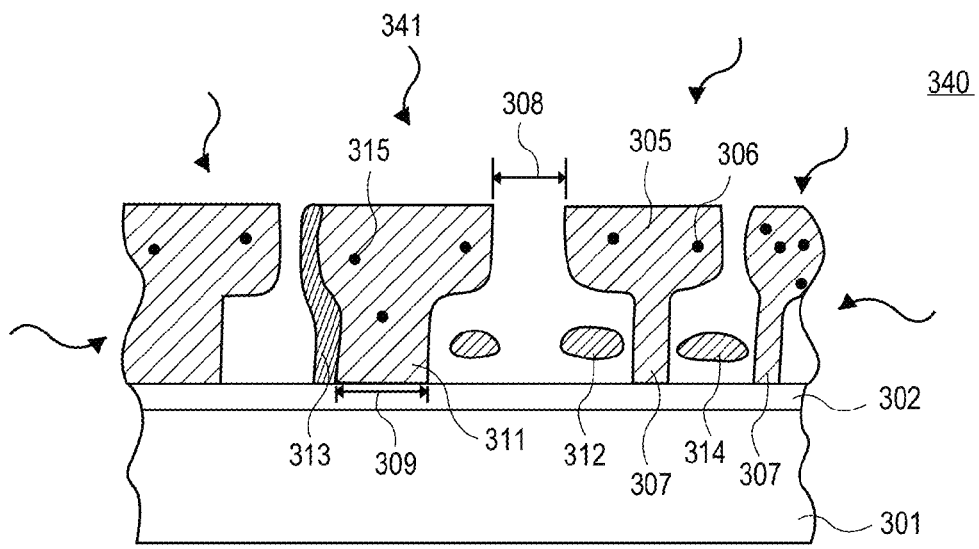
FIG. 3E is a view similar to FIG. 3E illustrating an embodiment of annealing of a seed layer structure comprising a crystallization catalyst material on a seed semiconductor layer over a substrate, wherein the seed semiconductor layer comprises an amorphous portion.

FIG. 3E is a view 340 similar to FIG. 3E illustrating an embodiment of annealing of a seed layer structure comprising a crystallization catalyst material on a seed semiconductor layer over a substrate, wherein the seed semiconductor layer comprises an amorphous portion. As shown in FIG. 3E, annealing 341 converts the amorphous portion of the seed semiconductor layer 303 into polycrystalline portions ("mesas"), such as polycrystalline mesa portion 305. Polycrystalline portion 305 has a mesa-like shape having a flat top and steep sides. The mesa polycrystalline portions are connected to the insulating layer 302 on the substrate 301 by subsurface crystal legs, such as a subsurface crystal leg 307 and a subsurface crystal leg 311. As shown in FIG. 3E, crystallization catalyst material portions, such as crystallization catalyst material portion 312, 313, and 314 are formed underneath the polycrystalline portions. During annealing process amorphous semiconductor material becomes crystallized. The crystallization process is induced by crystallization catalyst material.

As shown in FIG. 3E, polycrystalline portions, such as polycrystalline portion 305 are doped by crystallization catalyst material. The crystallization catalyst material atoms are incorporated into the seed semiconductor atoms and act as dopant particles, e.g., a dopant particle 315 and a dopant particle 306 in the seed polycrystalline semiconductor portions. The residual crystallization catalyst material, which is not incorporated into the seed polycrystalline semiconductor, is deposited underneath the crystallization layer to form contaminant mass portions, such as portions 312, 313, and 314. In one embodiment the temperature of annealing is in an approximate range from about 300° C. to about 600° C. In one embodiment, the annealing is performed in a belt furnace having the following conditions: temperature of zone 1 is about 500° C.; temperature of zone 2 is about 500° C., temperature of zone 3 is about 500° C., and speed is about 0.1 cm/sec.

The crystallization catalyst material moves down from the top of the seed semiconductor layer to the interface with the substrate leaving openings ("chimneys") in the seed semiconductor portions, such as an opening 308. In one embodiment, the size of openings, such as opening 308 is controlled by adjusting annealing conditions. In one embodiment, the size of openings is about from 1 to 10 μm. In one embodiment, density of the openings formed through the seed semiconductor layer down to the substrate is controlled by adjusting annealing conditions.

In one embodiment, density of the subsurface crystal legs is controlled by adjusting annealing conditions. In one embodiment, the size of the subsurface crystal legs, such as a size 309 is controlled by adjusting annealing conditions. For example, a temperature profile of the annealing is adjusted to control at least one of the subsurface crystal legs and the openings.

In one embodiment, the annealing process is performed at a constant temperature. In one embodiment, the annealing process has a "ramp-up" temperature profile that positively impacts the resulting grain size. In one embodiment, the temperature of the annealing rises from about 300° C. to about 500° C., and then goes down to about 200° C.

In other embodiments, the thermal annealing temperature profile is a linear (including a constant straight line), sinusoidal, step function or any other temperature profile.

In one embodiment, the temperature profile of the annealing is a step-like function (e.g., versus time). In one embodiment, the temperature profile of the annealing has a temperature slope against time substantially lower than a conventional annealing temperature profile has. In one embodiment, during the annealing process the temperature rises with time substantially slower than during the conventional annealing. In one embodiment, the annealing process is performed in a standard atmosphere environment. In one embodiment the annealing process is performed in a nitrogen environment by using a simple negative pressure setup (i.e. flow a lot of nitrogen into the chamber to push out all atmosphere).

In one embodiment, the density of the subsurface legs is controlled by adjusting a ratio of the seed semiconductor material and the crystallization catalyst material. In one embodiment, the ratio of the seed semiconductor material and the crystallization catalyst material is adjusted to control the density of openings for removing the residual catalyst material from underneath the polycrystalline portions. In one embodiment, a ratio of the seed semiconductor material and the crystallization catalyst material is adjusted to control at least one of the subsurface crystal legs and the openings.

In one embodiment the ratio of the seed semiconductor material (e.g., a-Si) and the crystallization catalyst material (e.g., Al) is about 1:3. A lower ratio of the seed semiconductor material (e.g., a-Si) and the crystallization catalyst material can increase grain sizes but results in greater opening ("hole") density. A higher ratio of the seed semiconductor material (e.g., a-Si) and the crystallization catalyst material can lead to smaller grains and more but smaller holes.

Figure 3F:
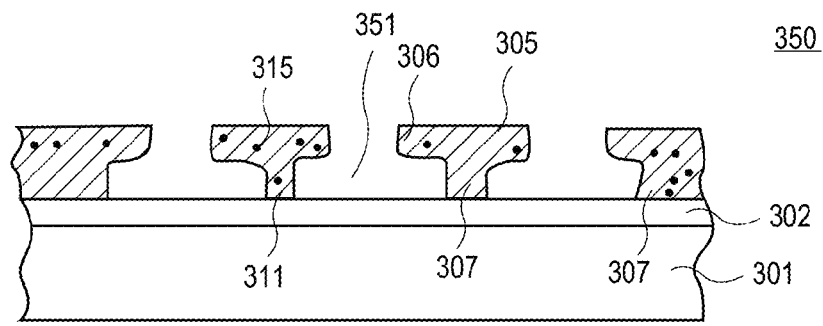
FIG. 3F is a view similar to FIG. 3E after crystallization catalyst material is removed from the underneath the crystalline portions.

FIG. 3F is a view 350 similar to FIG. 3E after crystallization catalyst material is removed from the underneath the polycrystalline portions. In one embodiment, the crystallization catalyst material is removed from the underneath the polycrystalline portion by wet etching of the crystallization catalyst material through the openings in the polycrystalline portions, such as opening 308. In one embodiment, wet etching is performed using Transene Aluminum Etch Type D at temperature about 50° C. for about 20 min. As shown in FIG. 3E, the seed semiconductor comprises polycrystalline portions, such as portion 305 connected to the insulating layer 302 on the substrate 301 by subsurface crystal legs, such as legs 311 and 307. The subsurface crystal legs, such as legs 311 and 307 are separated by cavities, such as a cavity 351. The cavities are hollow spaces that do not contain the crystallization catalyst material.

Figure 3G:
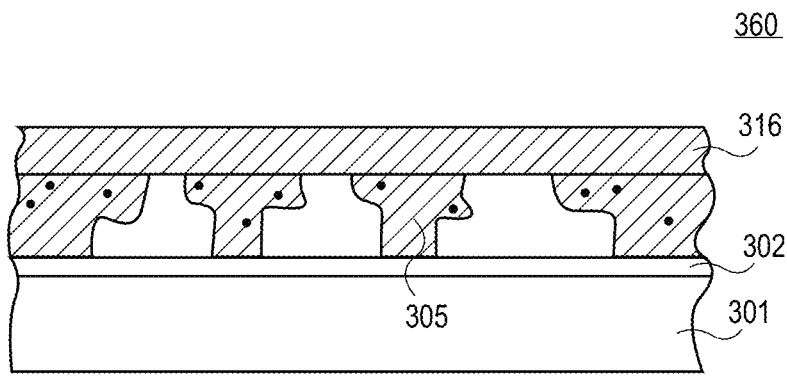
FIG. 3G is a view similar to FIG. 3F after an epitaxial semiconductor layer is deposited on the seed crystalline portions.

FIG. 3G is a view 360 similar to FIG. 3F after an epitaxial semiconductor layer is deposited on the seed polycrystalline portions. In one embodiment, an epitaxial semiconductor layer 316 is a silicon layer. In other embodiments, an epitaxial semiconductor layer 316 is other semiconductor material, e.g., silicon carbide, germanium, or other semiconductor material. In one embodiment, the crystalline semiconductor layer 316 is the same semiconductor as the seed semiconductor. For example, if the seed semiconductor is amorphous silicon, the crystalline semiconductor layer is silicon. In other embodiment, the crystalline semiconductor layer 316 is a semiconductor other than the seed layer. In one embodiment, crystalline semiconductor layer 316 is a polycrystalline semiconductor. In one embodiment, crystalline semiconductor layer 316 is a monocrystalline semiconductor. A crystalline semiconductor layer 316 can be deposited on the seed polycrystalline portions, such as portion 305 on substrate 301 using e.g., chemical vapour deposition ("CVD"), PECVD, metalorganic chemical vapour deposition ("MOCVD"), atomic layer deposition ("ALD"), or any other deposition techniques known to one of ordinary skill in the art of electronic device manufacturing. The thickness of the semiconductor layer 316 depends on application. In one embodiment, the thickness of the semiconductor layer 316 is from about 300 nm to about 2 μm. In one embodiment, for example, for solar cell applications, the thickness of the semiconductor layer 316 is from about 2 μm to about 30 μm.

Figure 3H:
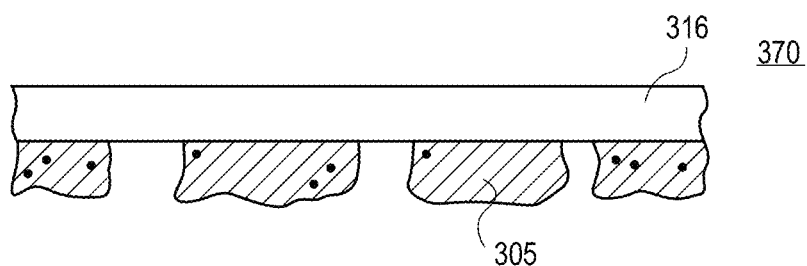

FIG. 3H is a view 370 similar to FIG. 3G after the epitaxial layer 316 on the seed polycrystalline portions 305 is removed from the substrate 301. In one embodiment, the density of cavities on the substrate controls adhesion of the seed semiconductor to the substrate. In one embodiment, the size of cavities controls adhesion of the seed semiconductor to the substrate. In one embodiment, the substrate 301 is removed by cleaving along a line crossing the subsurface crystal legs. In one embodiment, the substrate 301 is removed by wet etching. In one embodiment, the epitaxial layer 316 is removed from the substrate 301 by attaching another substrate (e.g., a flexible plastic substrate, or tape) on top of the epitaxial layer 316 and peeling off the epitaxial layer 316 from the substrate 301, as described in further detail with respect to FIG. 9.

Figure 3I:
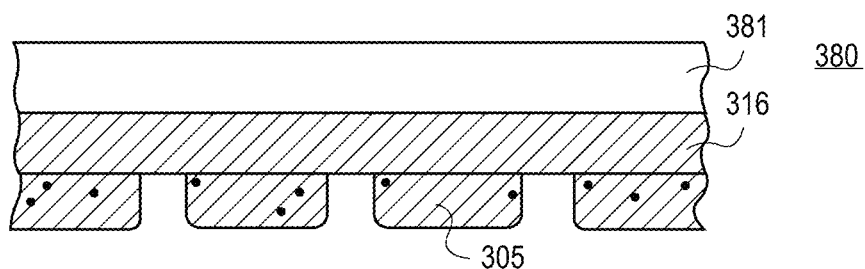
FIG. 3I is a view similar to FIG. 3H after the epitaxial semiconductor layer on seed semiconductor portions is transferred to another substrate.

FIG. 3I is a view 380 similar to FIG. 3H after the crystalline semiconductor layer 316 on seed semiconductor portions, such as portion 305 is transferred to another substrate. A substrate 381 is attached to crystalline semiconductor layer 316. In one embodiment, substrate 381 is a glass substrate. In one embodiment, substrate 381 is a flexible plastic substrate. In one embodiment, substrate 381 is a semiconductor substrate. In one embodiment, the crystalline semiconductor layer on the seed semiconductor portions, such as portion 305 is attached to another substrate using for example adhesive, thermal bonding, or other technique known to one of ordinary skill in the art of electronic device manufacturing.

Figure 3J:
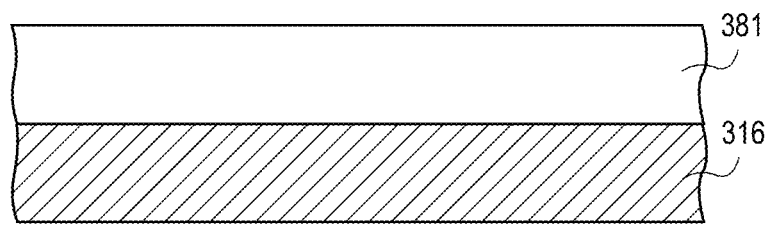
FIG. 3J is a view similar to FIG. 3I, after seed crystalline portions 316 and remaining portions of the subsurface crystal legs are removed.

FIG. 3J is a view similar to FIG. 3I, after seed crystalline portions 316 and remaining portions of the subsurface crystal legs are removed. After the epitaxial layer 316 is transferred to another substrate 381, the seed crystalline portions 316 and remaining portions of the subsurface crystal legs can be removed by for example, chemical-mechanical polishing, or any other technique known to one of ordinary skill in the art of electronic device manufacturing.

Figure 4A:
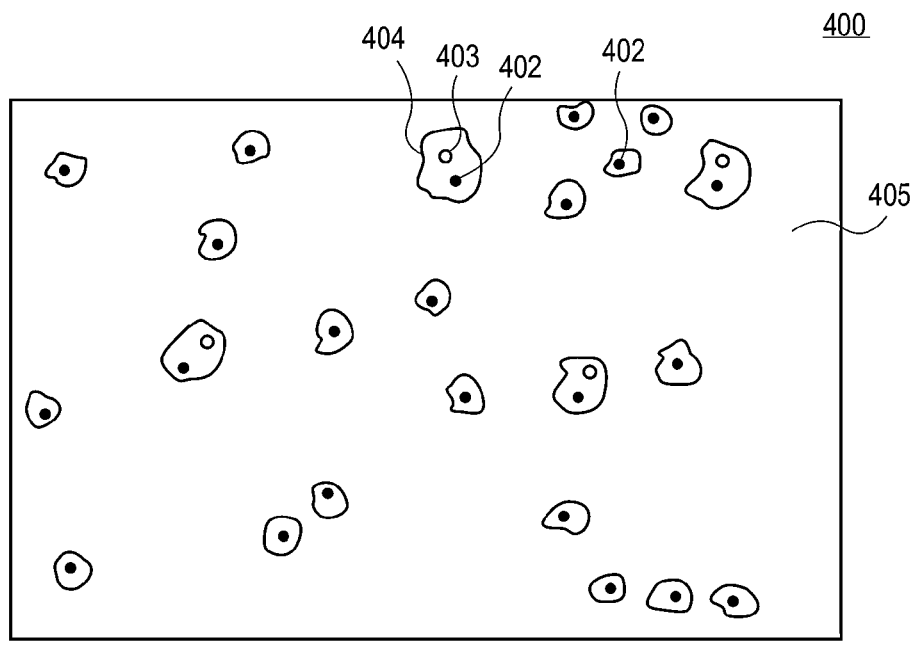
FIGS. 4A and 4B show a top view and a cross-sectional view of one embodiment of a semiconductor structure having an epitaxial semiconductor layer on seed semiconductor mesa portions, such as seed crystalline semiconductor portion connected to a glass substrate by subsurface crystal legs.
Figure 4B:
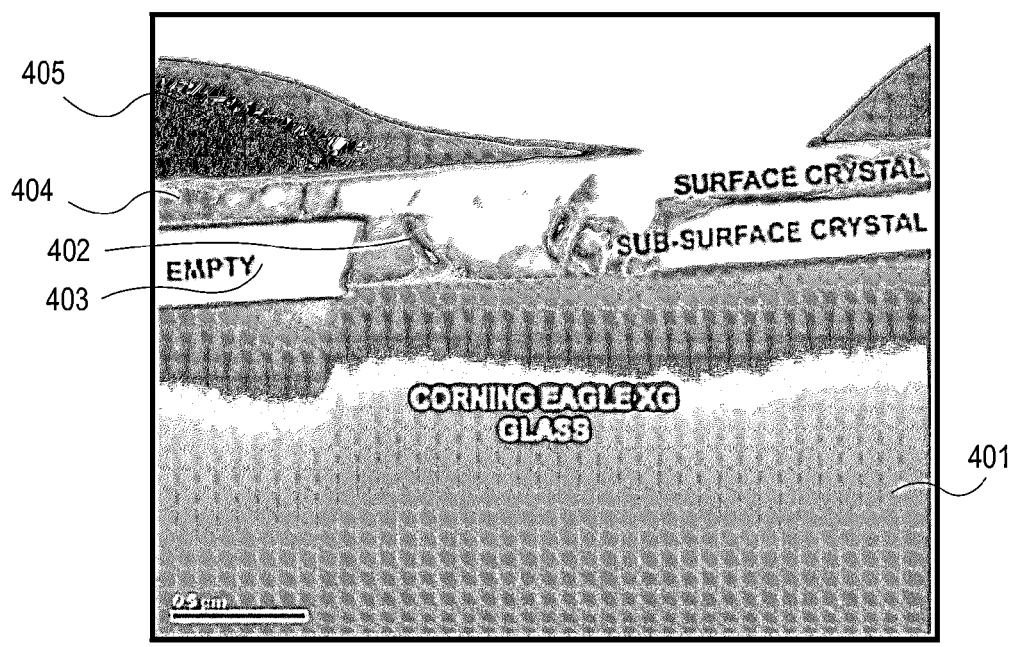

FIGS. 4A and 4B show a top view 400 and a cross-sectional view 410 of one embodiment of a semiconductor structure having an epitaxial semiconductor layer 405 on seed semiconductor mesa portions, such as a seed polycrystalline semiconductor portion 404 connected to a glass substrate 401 by subsurface crystal legs, such as a subsurface crystal leg 402. As shown in FIGS. 4A and 4B the subsurface crystal legs are separated by cavities, such as a cavity 403. The aluminum contamination is removed that has resulted in "mesas" of high quality silicon that are attached to the underlying substrate at some small percentage of the total area.

Figure 5:
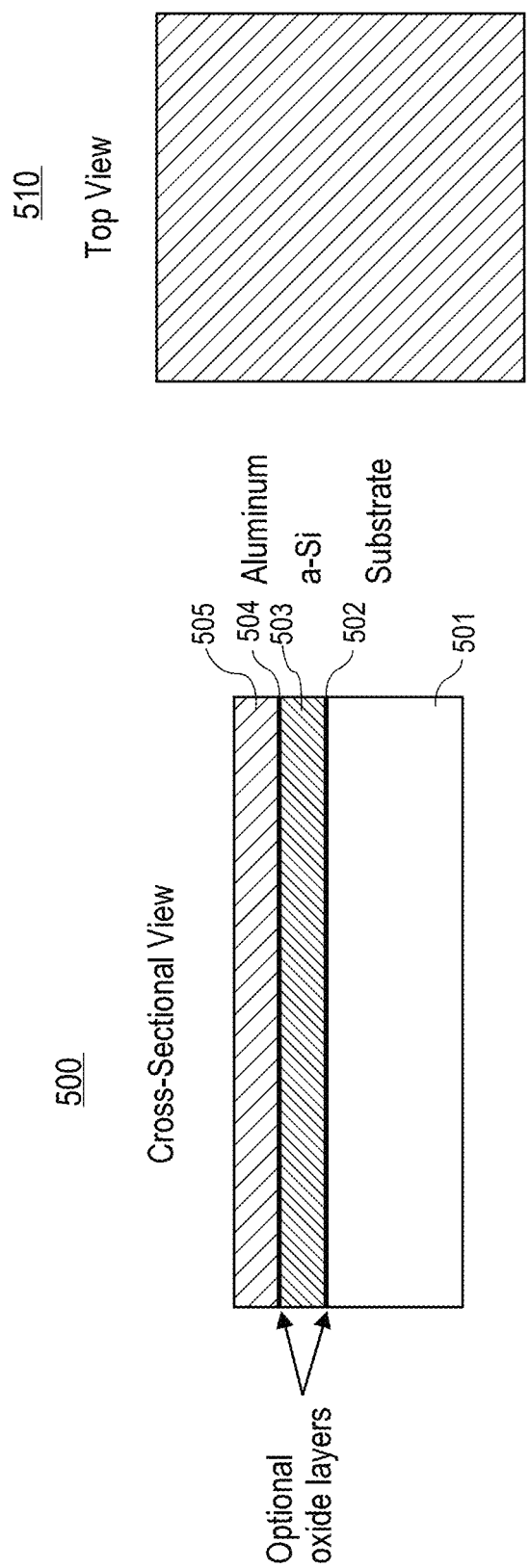
FIG. 5 shows a cross-sectional view and a top view of one embodiment of a semiconductor structure to provide top-down crystallization catalyst induced crystallization.

FIG. 5 shows a cross-sectional view 500 and a top view 510 of one embodiment of a semiconductor structure to provide top-down crystallization catalyst induced crystallization. The semiconductor structure comprises a substrate 501. Substrate 501 represents one of the substrates described above.

A thin layer of an insulating material 502 is deposited on substrate 501, as described above with respect to insulating layer 302. A seed semiconductor layer having an amorphous portion 503 is deposited onto the insulating layer 502 on the substrate 501, as described above. An optional thin layer of an insulating material 504 is deposited onto the seed semiconductor layer having an amorphous portion 503. The processing conditions (e.g., temperature, pressure, flow rates) for depositing the insulating layer 504 are the same as for depositing of the insulating layer 502, but the process is performed for time shorter than time for depositing insulating layer 302, e.g., only for about 1-2 seconds, as described above with respect to FIG. 3C. The optional insulating layer makes it harder for crystallization catalyst material deposited thereon to travel to the substrate during crystallization. The optional insulating layer can be deposited to control the size of the grains during crystallization. A crystallization catalyst material 505 (e.g., Al) is deposited onto the thin layer of insulating material 504 (e.g., $SiO_2$). The crystallization catalyst material 505 represents one of the crystallization catalyst material layers described above.

Figure 6:
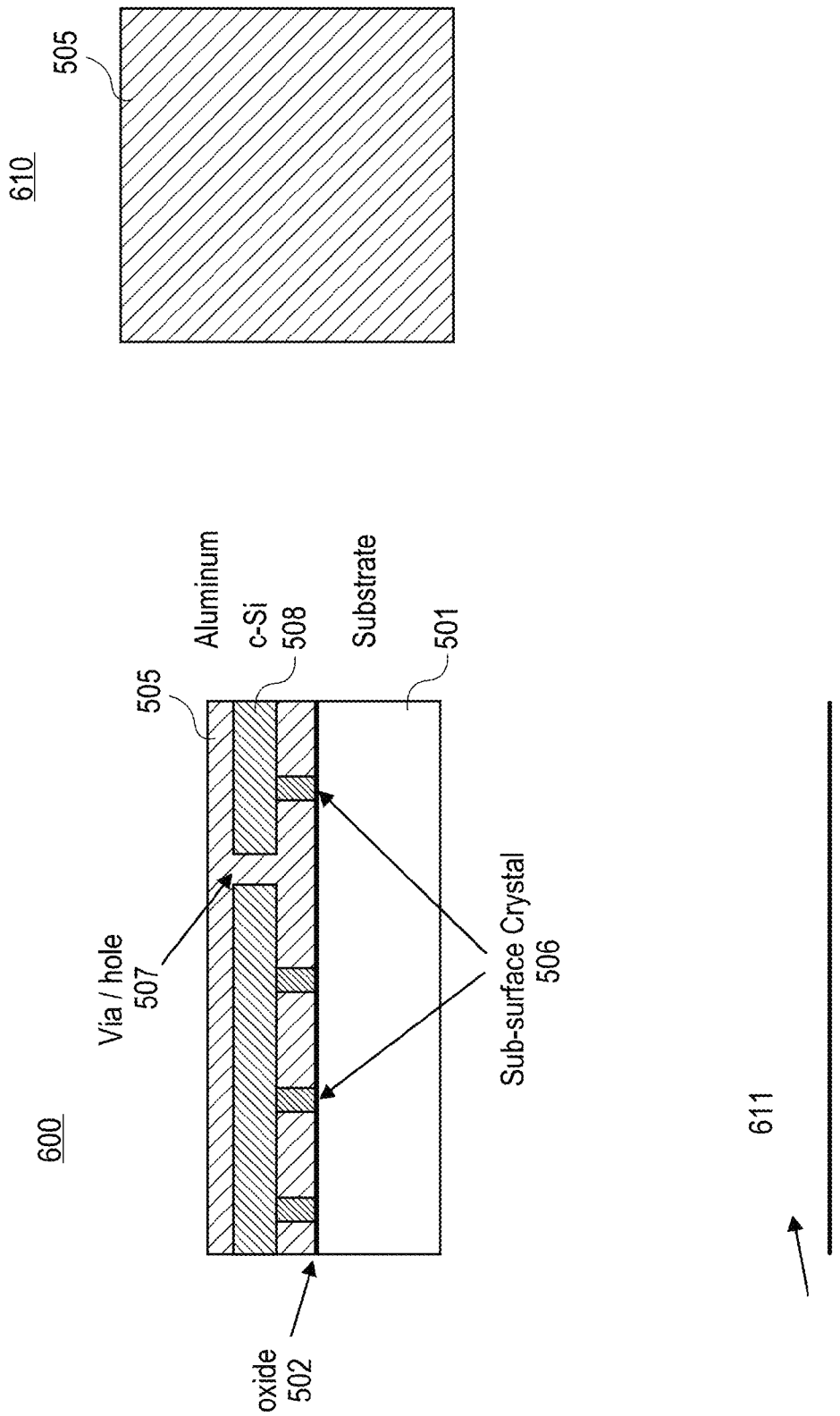
FIG. 6 shows a cross-sectional view and a top view similar to FIG. 5 illustrating an embodiment of annealing of a seed layer structure comprising a crystallization catalyst material on the insulating layer on the seed semiconductor layer over the substrate, wherein the seed semiconductor layer comprises an amorphous portion.

FIG. 6 shows a cross-sectional view 600 and a top view 610 similar to FIG. 5 illustrating an embodiment of annealing of a seed layer structure comprising a crystallization catalyst material on the insulating layer 504 on the seed semiconductor layer over the substrate, wherein the seed semiconductor layer comprises an amorphous portion, as described above. As shown in FIG. 6, annealing 611 converts the amorphous portion of the seed semiconductor layer into polycrystalline portions ("mesas"), such as polycrystalline mesa portion 508, as described above. In one embodiment, insulating layer 504 is consumed by the polycrystalline portions, such as a portion 508 during annealing, and does not longer exist. In one embodiment, the polycrystalline mesa portion 508 is c-Si. The mesa polycrystalline portions are connected to the insulating layer 502 on the substrate 501 by subsurface crystal legs 506, as described above. During annealing process 611 amorphous semiconductor material becomes crystallized. The crystallization process is induced by crystallization catalyst material, as described above. During annealing portions of the crystallization catalyst material 505 are driven through the insulating layer 504 and the seed semiconductor layer portions 508 down to the substrate 501. Portions of the crystallization catalyst material 505 are formed underneath the polycrystalline portions 508, as described above.

Figure 7:
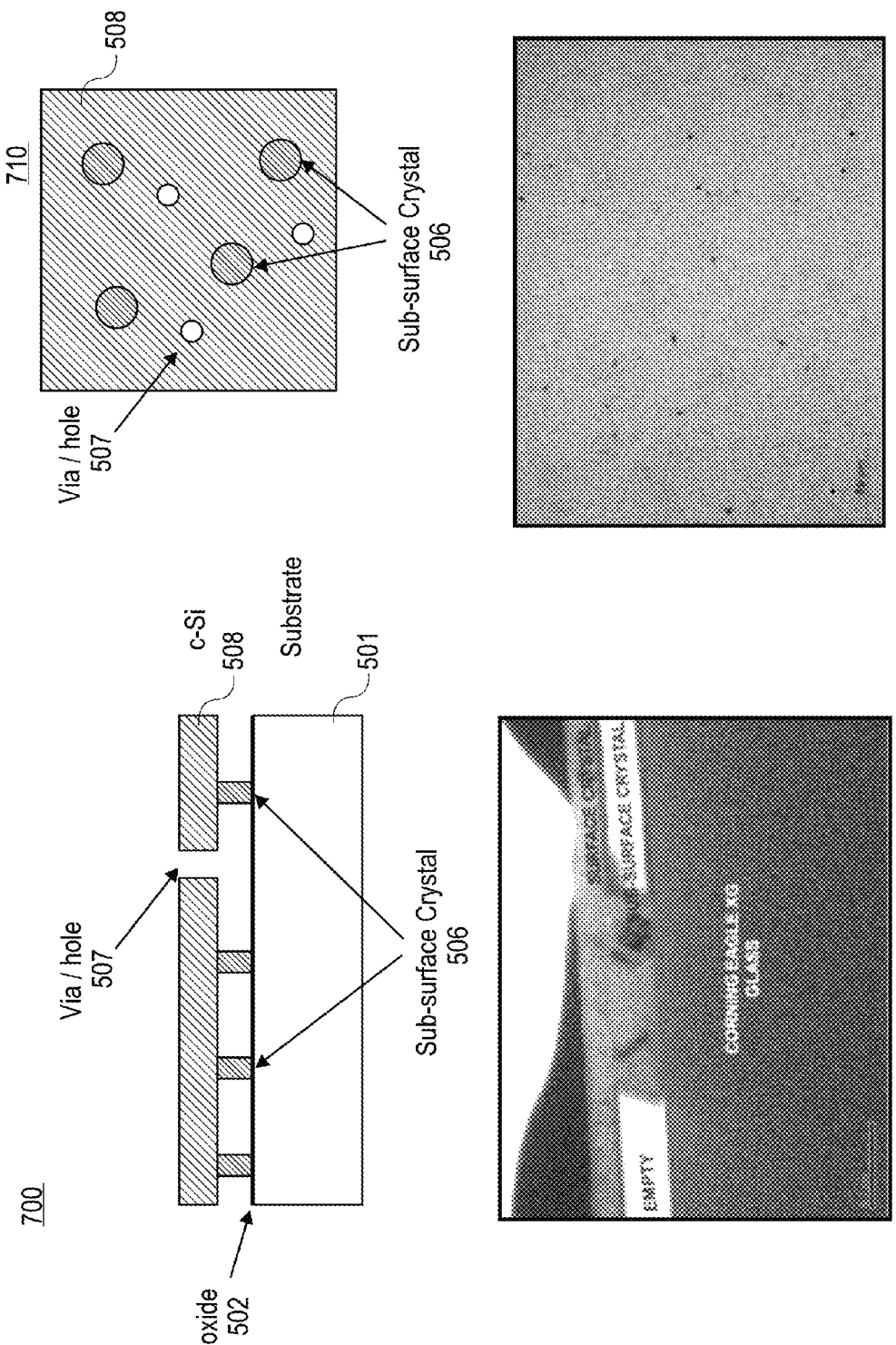
FIG. 7 shows a cross-sectional view and a top view similar to FIG. 6 after crystallization catalyst material is removed from the underneath the crystalline portions.

FIG. 7 shows a cross-sectional view 700 and a top view 710 similar to FIG. 6 after crystallization catalyst material is removed from the underneath the polycrystalline portions. In one embodiment, the crystallization catalyst material is removed from the underneath the polycrystalline portion by wet etching, as described above. As shown in FIG. 7, the seed semiconductor comprises polycrystalline portions, such as portion c-Si portion 508 connected to the insulating layer 502 on the substrate 501 by subsurface crystal legs 506. The subsurface crystal legs, such as legs 506 are separated by cavities, as described above. Polycrystalline portions 508 are separated by openings, such as a via/hole 507. In one embodiment, the amount of the via/holes 507 per a unit of surface area is well below 1%. As shown in view 710, there is less than 1% of the surface area occupied by via/holes. In general, the less the density of the via/holes is, the better as long as all the aluminum is removed from underneath of the seed crystalline layer. In one embodiment, the density of subsurface crystals legs is such that it is optimal for removing the epitaxial film from the substrate while still maintaining integrity (i.e. it does not collapse on itself). In one embodiment, the amount of the subsurface crystals 506 per a unit of surface area is from about 5% to about 20%. As shown in view 710, there is less than 5-20% of the surface area occupied by the subsurface crystals.

Figure 8:
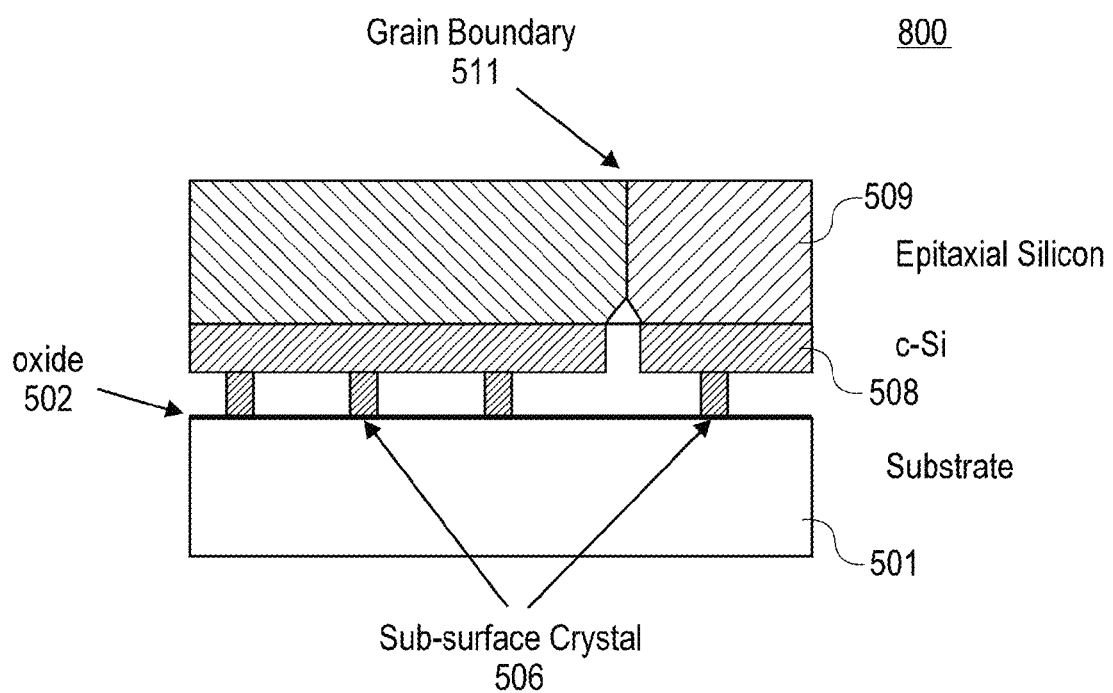
FIG. 8 shows a cross-sectional view similar to FIG. 7 after an epitaxial semiconductor layer is deposited on the insulating layer on the seed crystalline portions.

FIG. 8 shows a cross-sectional view 800 similar to FIG. 7 after an epitaxial semiconductor layer 509 is deposited on the optional insulating layer 504 on the seed polycrystalline portions. Epitaxial semiconductor layer 509 comprises ultralarge grains separated by grain boundaries, such as a grain boundary 511. In one embodiment, epitaxial semiconductor layer 509 is a silicon layer. In other embodiments, epitaxial semiconductor layer 509 is other semiconductor material, e.g., silicon carbide, germanium, or other semiconductor material. In one embodiment, epitaxial semiconductor layer 509 represents one of the epitaxial semiconductor layers described above.

Figure 9:
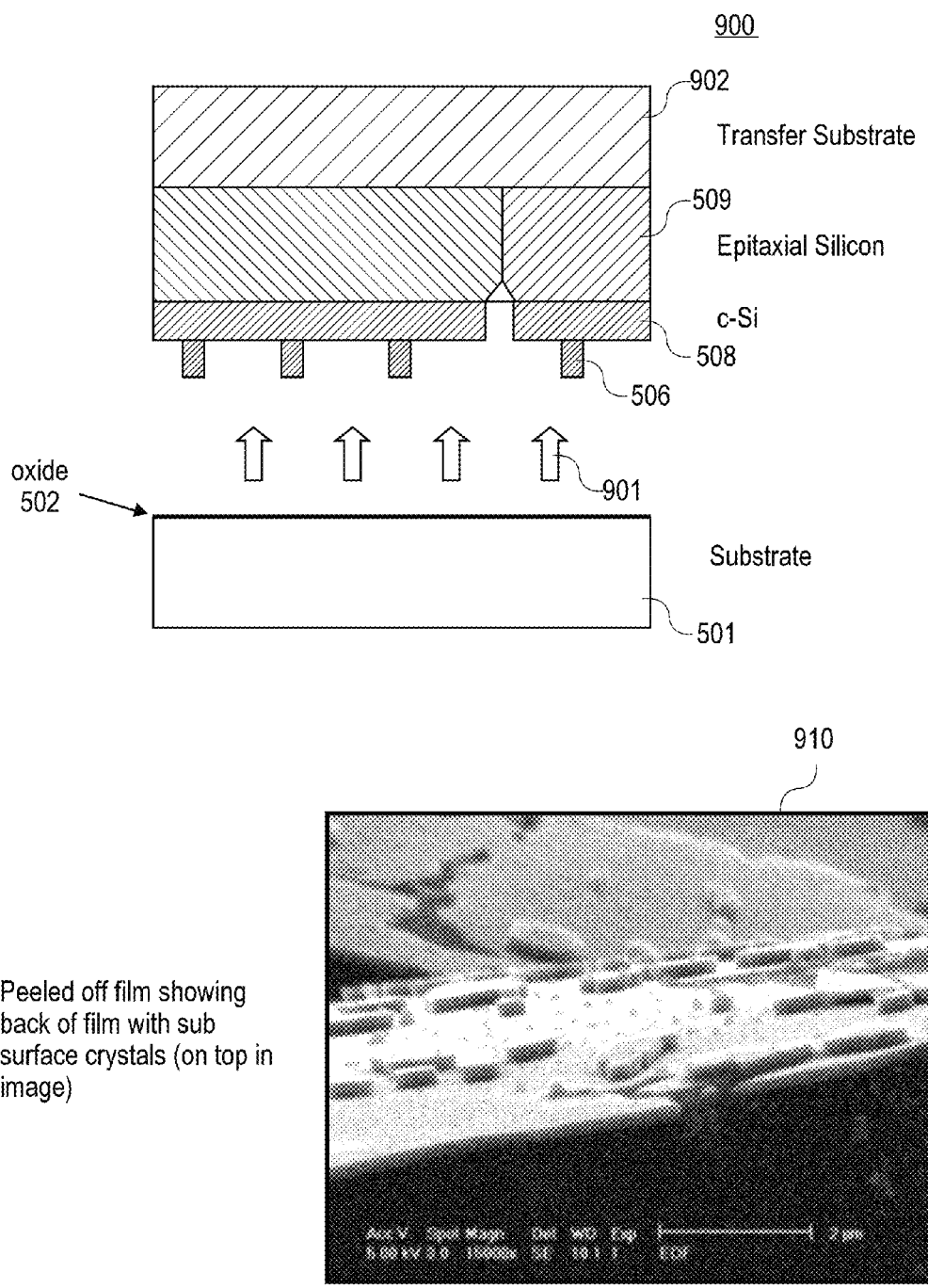
FIG. 9 is a view similar to FIG. 8 after the insulating layer on substrate is removed from the subsurface crystal legs.

FIG. 9 is a view 900 similar to FIG. 8 after the insulating layer 502 on substrate 501 is removed from the subsurface crystal legs 506. In one embodiment, the density of subsurface crystal legs controls adhesion of the seed semiconductor to the substrate. In one embodiment, the size of subsurface crystal legs controls adhesion of the seed semiconductor to the substrate. As shown in FIG. 9, the epitaxial semiconductor layer 509 (e.g., epitaxial silicon) on seed semiconductor portions (e.g., c-Si), such as portion 508 is attached to a transfer substrate 902. Substrate 902 is adjacent to the surface of the epitaxial semiconductor layer 509. Flexible transfer substrate 902 attached to the surface of the epitaxial layer 509 is peeled off from the substrate 501, as shown in FIG. 9. In one embodiment, substrate 902 is a flexible plastic substrate (e.g., a tape). In one embodiment, the epitaxial semiconductor layer 509 is attached to substrate 902 using adhesive or other technique known to one of ordinary skill in the art of electronic device manufacturing. After the epitaxial layer 509 is transferred to substrate 902, the seed crystalline portions 508 and remaining portions of the subsurface crystal legs 506 can be removed by for example, chemical-mechanical polishing, or any other technique known to one of ordinary skill in the art of electronic device manufacturing.

FIG. 9 also shows a picture 910 of a peeled off film showing back of the crystalline film grown on the seed polycrystalline semiconductor film having with subsurface crystals using methods described herein.

Figure 10:
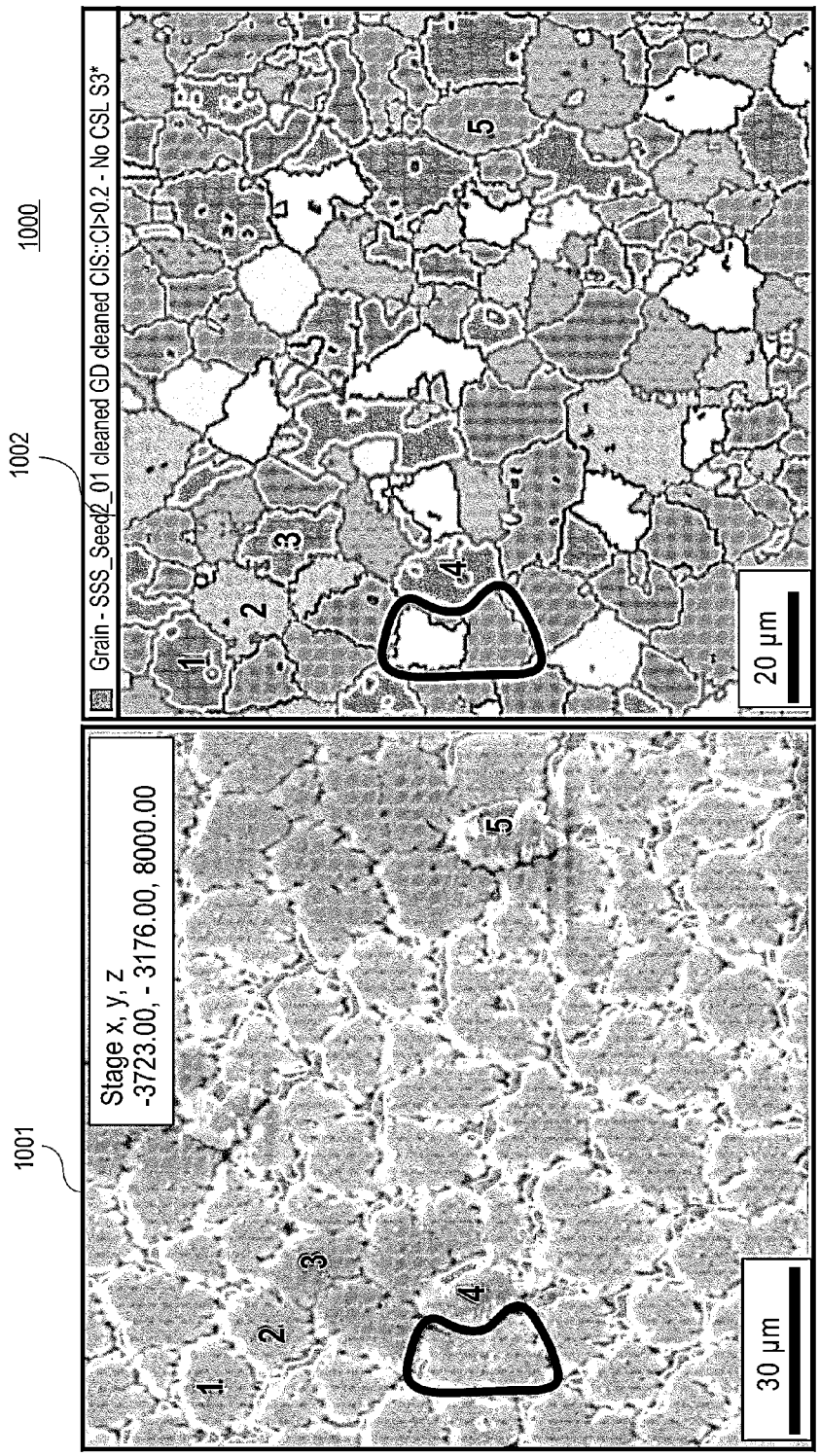
FIG. 10 is a view showing a SEM and EBSD images of one embodiment of preliminary TAIC large grain polysilicon films with grain gaps on a glass substrate.

FIG. 10 is a view 1000 showing a SEM and EBSD images 1001 and 1002 of one embodiment of preliminary TAIC large grain polysilicon films with grain gaps on a glass substrate. As shown in images 1001 and 1002, large polysilicon crystal grains 1, 2, 3, and 4 are formed using methods as described herein. The crystallization catalyst material can be removed by wet etching through the grain gaps, as described herein.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method to manufacture an electronic device, comprising:
    annealing a seed layer structure, the seed layer structure comprising a crystallization catalyst material on a seed semiconductor layer over a substrate, wherein the seed semiconductor layer comprises an amorphous portion, and wherein the annealing is to convert the amorphous portion into a crystalline portion, wherein the crystalline portion is connected to the substrate by subsurface crystal legs, and wherein the crystallization catalyst material is formed underneath the crystalline portion; and
    removing the crystallization catalyst material from the underneath the crystalline portion.

2. The method of claim 1, further comprising
controlling a density of the subsurface crystal legs.

3. The method of claim 2, wherein the density of the subsurface legs is
    controlled by annealing.

4. The method of claim 3, wherein the density of the subsurface legs is
    controlled by adjusting a ratio of the seed semiconductor material and the crystallization catalyst material.

5. The method of claim 1, further comprising
    controlling a density of openings formed through the seed semiconductor layer down to the substrate.

6. The method of claim 1, wherein the crystallization catalyst material is removed from the underneath the crystalline portion by wet etching.

7. The method of claim 1, further comprising
    depositing an insulating layer between the substrate and seed semiconductor layer.

8. The method of claim 1, further comprising
    forming an epitaxial semiconductor layer on the crystalline portion.

9. The method of claim 1, further comprising
    removing the substrate.

* * * * *